(12) United States Patent
Makino (10) Patent No.: US 11,385,302 B2
(45) Date of Patent: Jul. 12, 2022

(54) MAGNETIC FLUX ABSORBER AND MAGNETIC SENSOR HAVING THE SAME

(71) Applicant: TDK Corporation, Tokyo (JP)

(72) Inventor: Kenzo Makino, Tokyo (JP)

(73) Assignee: TDK Corporation, Tokyo (JP)

( * ) Notice: Subject to any disclaimer, the term of this patent is extended or adjusted under 35 U.S.C. 154(b) by 142 days.

(21) Appl. No.: 16/798,796

(22) Filed: Feb. 24, 2020

(65) Prior Publication Data
US 2020/0292630 A1  Sep. 17, 2020

(30) Foreign Application Priority Data
Mar. 12, 2019  (JP) .............................. JP2019-044489

(51) Int. Cl.
*G01R 33/00* (2006.01)
*G01R 33/09* (2006.01)
*H01F 27/34* (2006.01)

(52) U.S. Cl.
CPC ......... *G01R 33/0017* (2013.01); *G01R 33/09* (2013.01); *H01F 27/346* (2013.01)

(58) Field of Classification Search
CPC .... G01R 33/0017; G01R 33/09; H01F 27/346
See application file for complete search history.

(56) References Cited

U.S. PATENT DOCUMENTS

| 4,896,235 | A | * | 1/1990 | Takino | ................. | G11B 5/3903 |
| | | | | | | 324/252 |
| 5,739,991 | A | * | 4/1998 | Matono | ............... | G11B 5/3906 |
| | | | | | | 360/125.41 |
| 5,991,125 | A | * | 11/1999 | Iwasaki | ................. | B82Y 10/00 |
| 2001/0053053 | A1 | * | 12/2001 | Saito | ..................... | H01F 41/302 |
| | | | | | | 360/324.11 |
| 2002/0008945 | A1 | * | 1/2002 | Mack | .................. | G11B 5/3967 |
| | | | | | | 360/319 |
| 2006/0039089 | A1 | * | 2/2006 | Sato | ..................... | G11B 5/3903 |
| | | | | | | 360/324 |
| 2009/0224342 | A1 | * | 9/2009 | Nakayama | ............ | H01L 27/228 |
| | | | | | | 257/E29.323 |
| 2009/0244788 | A1 | | 10/2009 | Sato | | |
| 2013/0057266 | A1 | | 3/2013 | Nishiyama et al. | | |
| 2014/0104941 | A1 | * | 4/2014 | Kondo | ................. | G11C 11/161 |
| | | | | | | 365/171 |

FOREIGN PATENT DOCUMENTS

| JP | 2006086508 A | 3/2006 |
| JP | 2007242140 A | 9/2007 |
| JP | 2018-004459 A | 1/2018 |

* cited by examiner

*Primary Examiner* — Alvaro E Fortich
(74) *Attorney, Agent, or Firm* — Posz Law Group, PLC (57) ABSTRACT

A magnet flux absorber of the present invention has a soft magnetic layer having a first surface and a second surface that is a back surface of the first surface, as well as and at least one magnetically pinning portion that faces a part of the first surface of the soft magnetic layer or a part of the second surface of the soft magnetic layer. A region of the soft magnetic layer that faces the magnetically pinning portion is magnetized by the magnetically pinning portion in a direction that is different from a direction in which at least a part of remaining region of the soft magnetic layer is magnetized.

22 Claims, 12 Drawing Sheets

MAGNETIC FLUX ABSORBER AND MAGNETIC SENSOR HAVING THE SAME

BACKGROUND OF THE INVENTION

Field of the Invention

The present application is based on and claims priority from JP2019-044489, filed on Mar. 12, 2019, the disclosure of which is hereby incorporated by reference herein in its entirety.

The present invention relates to a magnet flux absorber and a magnetic sensor having the same, particularly to the configuration of a magnetic shield.

Description of the Related Art

A magnetic sensor may include a magnetic shield that shields a magnetic field detecting element from an external magnetic field that is different from a magnetic field to be detected by the magnetic field detecting element. A magnetic shield absorbs much of the external magnetic field, but due to the magnetization of the magnetic shield itself, a magnetic field that leaks from the magnetic shield is applied to the magnetic field detecting element. Thus, the magnetic field detecting element is affected by the magnetization of the magnetic shield. The direction of the magnetization of the magnetic shield varies depending on the direction of an external magnetic field, and the direction of the leaking magnetic field that is applied to the magnetic field detecting element also varies accordingly. Variation of the direction of the leaking magnetic field reduces the accuracy of the magnetic field detecting element in detecting a magnetic field. It is therefore preferable that the magnetization direction of the magnetic shield be pinned as firmly as possible relative to an external magnetic field.

JP 2018-004459 discloses an electric current sensor in which a magnetic shield for shielding a magnetic field detecting element is provided with hard bias layers. The hard bias layers are provided at both ends of the magnetic shield in order to magnetize the magnetic shield into a single magnetic domain. JP 5505817 discloses an electric current sensor in which a magnetic shield for shielding a magnetic field detecting element consists of a multilayer structure of a soft magnetic layer and an antiferromagnetic layer. The soft magnetic layer is magnetized into a single magnetic domain by the antiferromagnetic layer.

SUMMARY OF THE INVENTION

In general, magnetic domains of a magnetic body are formed such that the sum of magnetostatic energy, exchange energy and magnetically anisotropic energy (hereinafter referred to as "magnetostatic energy etc.") is minimized. The magnetostatic energy is magnetic potential energy of a magnetic body that is present in a magnetic field. In a soft magnetic layer having a single magnetic domain, the magnetostatic energy increases at the edges thereof. Therefore, even if the soft magnetic layer is forcedly magnetized into a single magnetic domain by a hard bias layer or an antiferromagnetic layer, the magnetization of the soft magnetic layer is unstable. The exchange energy is energy that derives from magnetic coupling interaction that functions to align the spins in one direction in a ferromagnetic body. The exchange energy decreases when the spins align in one direction. When a magnetic domain is divided into small subdomains, the magnetostatic energy decreases, but the exchange energy increases. For this reason, a magnetic body is subjected to force that changes the magnetic domains such that the magnetostatic energy etc. is minimized. Therefore, there is the possibility that the magnetization direction of a magnetic shield is not sufficiently firmly pinned relative to an external magnetic field. This problem also occurs in other magnet flux absorbers, in addition to a magnetic shield.

It is an object of the present invention to provide a magnet flux absorber whose magnetization direction is more stable with respect to an external magnetic field.

A magnet flux absorber of the present invention comprises a soft magnetic layer having a first surface and a second surface that is a back surface of the first surface, as well as and at least one magnetically pinning portion that faces a part of the first surface of the soft magnetic layer or a part of the second surface of the soft magnetic layer. A region of the soft magnetic layer that faces the magnetically pinning portion is magnetized by the magnetically pinning portion in a direction that is different from a direction in which at least a part of remaining region of the soft magnetic layer is magnetized.

In the present invention, the magnetically pinning portion is provided on only a part of the first surface or the second surface of the soft magnetic layer, and the soft magnetic layer is made into a multi magnetic domain. Since the region of the soft magnetic layer, which is not opposite to the magnetically pinning portion, is not subjected to the magnetizing fixing force, the magnetic domain is formed by itself so as to reduce the magnetostatic energy etc. Therefore, according to the present invention, it is possible to provide a magnet flux absorber whose magnetization direction is more stable with respect to an external magnetic field.

The above and other objects, features and advantages of the present invention will become apparent from the following description with reference to the accompanying drawings which illustrate examples of the present invention.

DETAILED DESCRIPTION OF THE INVENTION

Figure 1:
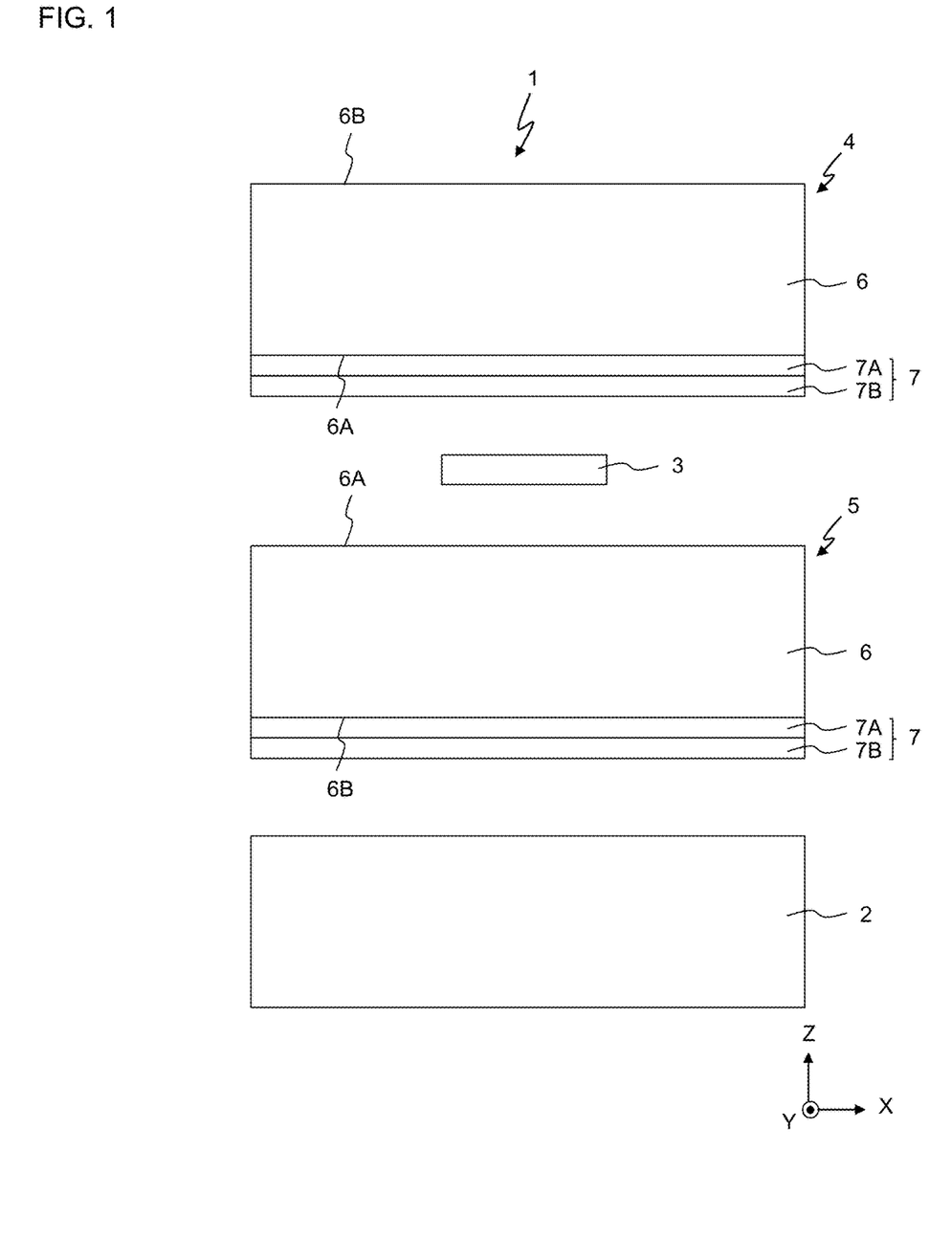
FIG. 1 is a schematic view of a magnetic sensor according to an embodiment of the present invention.

FIG. 1 schematically shows the configuration of magnetic sensor 1 of the present invention. Magnetic sensor 1 includes substrate 2, magnetic field detecting element 3 that is formed above substrate 2 and that detects a magnetic field, as well as upper magnetic shield 4 and lower magnetic shield 5 (examples of the magnet flux absorber) that are formed above substrate 2. Magnetic field detecting element 3 is not limited, and any type of element that uses magnetoresistive effect, such as a TMR element, a GMR element and an AMR element, may be used. The type of a magnetic field that is to be detected is not limited, but it is possible to detect, for example, a magnetic field that is induced by a current that flows through a conductive wire. In this case, magnetic sensor 1 operates as an electric current sensor. Upper magnetic shield 4 and lower magnetic shield 5 are provided on both sides of magnetic field detecting element 3, which is the object to be shielded, such that shields 4, 5 sandwich magnetic field detecting element 3. Upper and lower magnetic shields 4, 5 shield magnetic field detecting element 3 from an external magnetic field in order to enhance the accuracy in detecting a magnetic field that is induced, for example, by a current that flows through a conductive wire.

Various embodiments of upper and lower magnetic shields 4, 5 will be described below with reference to the drawings. Since the configurations of both magnetic shields 4, 5 are substantially the same, upper magnetic shield 4 will be mainly described here. In the following descriptions and drawings, the direction that is parallel to the long side of upper magnetic shield 4 is referred to as the X direction, the direction that is parallel to the short side of upper magnetic shield 4 is referred to as the Y direction, and the direction that is perpendicular both to the X direction and to the Y direction, or the direction that is perpendicular to first and second surfaces 6A, 6B of soft magnetic layer 6 and substrate 2 is referred to as the Z direction. Further, in each embodiment, first surface 6A or second surface 6B is divided into a plurality of imaginary small regions. The imaginary small regions do out overlap with each other and are arranged without any gap therebetween, and the combination of all the imaginary small regions coincides with first surface 6A or second surface 6B.

First Embodiment

Figure 2A:
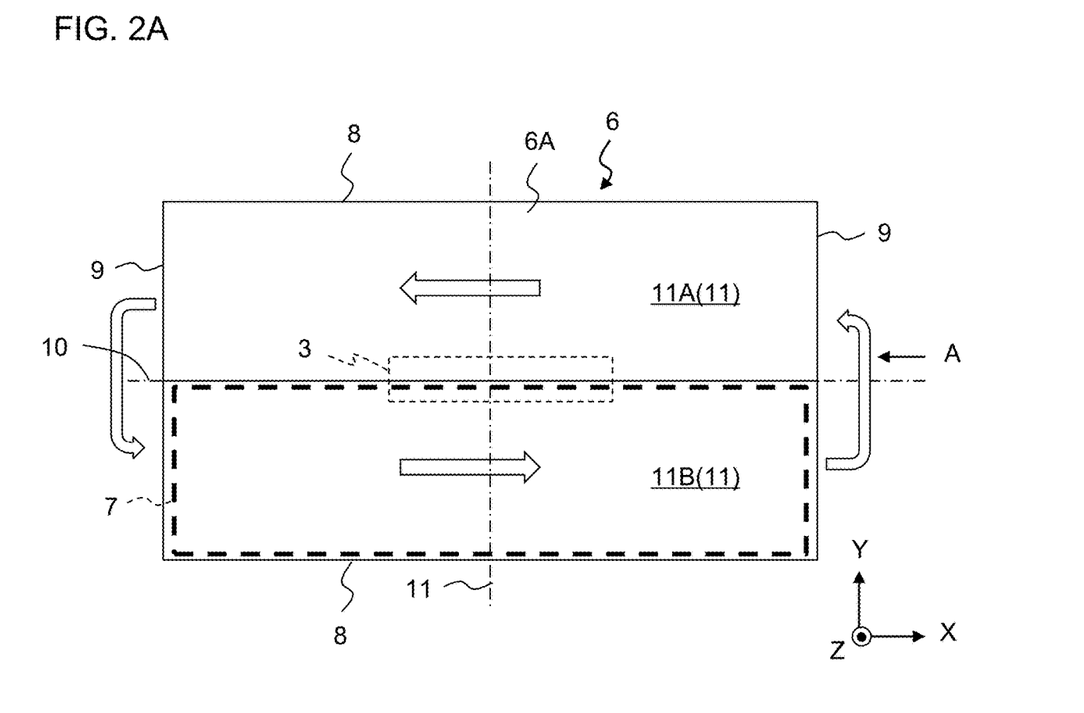
FIGS. 2A, 2B are plan views of the upper magnetic shield according to the first embodiment of the present invention.
Figure 2B:
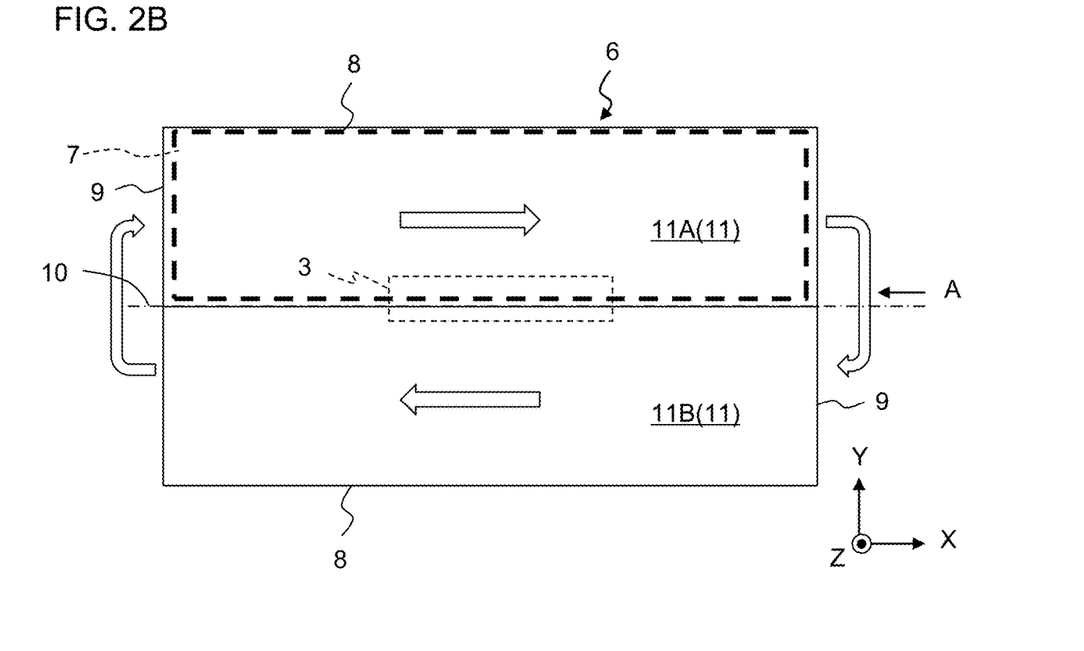
Figure 3A:
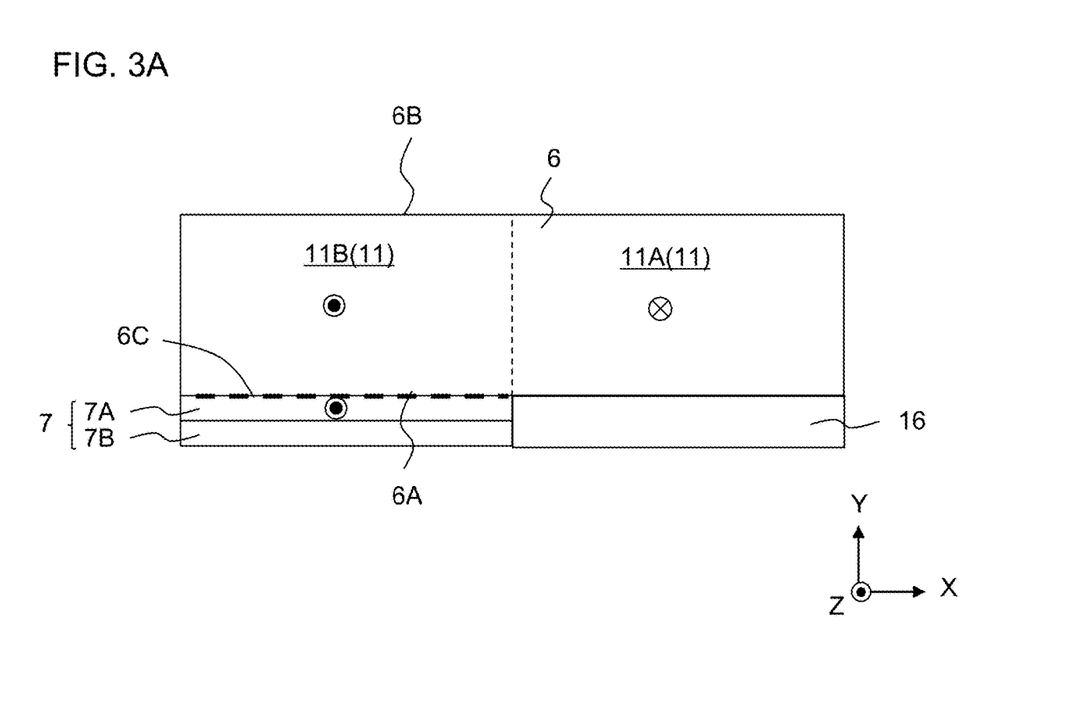
FIGS. 3A, 3B are side views of the upper magnetic shield, as viewed in direction A in FIGS. 2A, 2B.
Figure 3B:
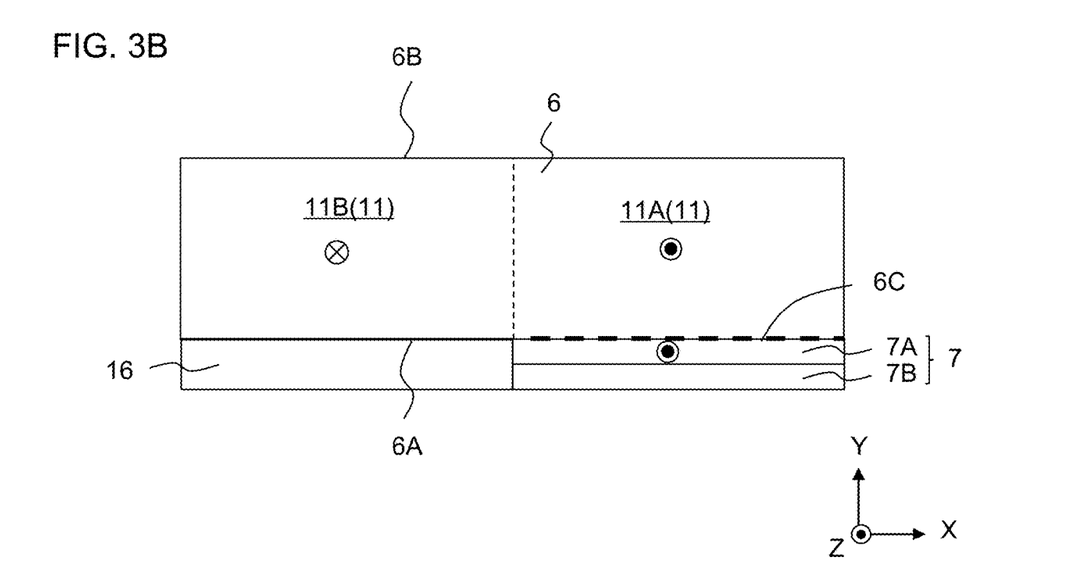

Referring to FIGS. 1 to 3B, the configuration of the magnetic shield according to the first embodiment of the present invention will be described. FIGS. 2A, 2B are plan views of upper magnetic shield 4, as viewed in the Z direction. FIG. 2A and FIG. 2B show upper magnetic shield 4 having the same configuration except that the position of magnetically pinning portion 7 is different. FIGS. 3A, 3B show side views of upper magnetic shield 4, as viewed from direction A in FIGS. 2A and 2B, respectively.

Referring to FIG. 1, upper magnetic shield 4 and lower magnetic shield 5 have soft magnetic layer 6 that is made of a soft magnetic material, such as NiFe. Soft magnetic layer 6 has substantially flat first surface 6A that faces magnetic field detecting element 3, as well as substantially flat second surface 6B that is the back surface of first surface 6A. First surface 6A of upper magnetic shield 4 faces magnetic field detecting element 3 and substrate 2. First surface 6A of lower magnetic shield 5 faces magnetic field detecting element 3, and second surface 6B of lower magnetic shield 5 faces substrate 2. Soft magnetic layer 6 has a generally rectangular parallelepiped shape, and first surface 6A, second surface 6B, and the surface of substrate 2 that faces lower magnetic shield 5 are parallel to each other. First surface 6A and second surface 6B may also be curved. Soft magnetic layer 6 overlaps with magnetic field detecting element 3, as viewed in the Z direction. Soft magnetic layer 6 may have a protrusion that covers the side of magnetic field detecting element 3. First surface 6A and second surface 6B are rectangular, as viewed in the Z direction.

Soft magnetic layers 6 of upper and lower magnetic shield 4, 5 are provided with magnetically pinning portions 7. Magnetically pinning portion 7 magnetizes the region of soft magnetic layer 6 that is provided with magnetically pinning portion 7 in a direction that is different from a direction in which at least a part of the remaining region of soft magnetic layer 6 is magnetized. In upper magnetic shield 4, magnetically pinning portion 7 is provided on a part of first surface 6A of soft magnetic layer 6, and in lower magnetic shield 5, magnetically pinning portion 7 is provided on a part of second surface 6B of soft magnetic layer 6. Magnetically pinning portion 7 of upper magnetic shield 4 consists of hard magnetic film 7A that is in contact with first surface 6A of soft magnetic layer 6 and seed layer 7B that in contact with hard magnetic film 7A and that improves coercive force of hard magnetic film 7A. In lower magnetic shield 5, hard magnetic film 7A is in contact with second surface 6B. Since it is desirable that seed layer 7B be formed prior to hard magnetic film 7A, seed layer 7B is provided between hard magnetic film 7A and substrate 2 both in upper magnetic shield 4 and in lower magnetic shield 5. Hard magnetic film 7A may be formed of a hard magnetic material, such as CoPt, CoCrPt and FePt. Seed layer 7B may be formed, for example, of CrTi. Insulating layer 16 is disposed where magnetically pinning portion 7 is not provided.

Magnetically pinning portion 7 may have an antiferromagnetic film (not illustrated), instead of hard magnetic film 7A and seed layer 7B. The antiferromagnetic film may be formed of an antiferromagnetic material, such as IrMn, FeMn, NiMn and PtMn. In one example, magnetically pinning portion 7 may be formed as a multilayer structure in which a Ta layer, a Ru layer, an IrMn layer (or another antiferromagnetic layer) and a CoFe layer are stacked in this order from the side of substrate 2 and in which the CoFe layer is in contact with first surface 6A of soft magnetic layer 6 of upper magnetic shield 4 or second surface 6B of soft magnetic layer 6 of lower magnetic shield 5. Magnetically pinning portion 7 may also be formed such that it is in contact with the opposite surface of soft magnetic layer 6. For example, magnetically pinning portion 7 may be formed as a multilayer structure in which a CoFe layer, an IrMn layer (or another antiferromagnetic layer) and a Ru layer are stacked in this order from the side of substrate 2 and in which the CoFe layer is in contact with second surface 6B of soft magnetic layer 6 of upper magnetic shield 4 or first surface 6A of soft magnetic layer 6 of lower magnetic shield 5. Thus, magnetically pinning portions 7 may be arranged on the outer sides of two soft magnetic layers 6.

Hard magnetic film 7A or the antiferromagnetic film of magnetically pinning portion 7 is magnetized in the long side direction (the X direction) in advance. Thus, the region of soft magnetic layer 6 that faces magnetically pinning portion 7 is magnetized in the same direction (the X direction) as magnetically pinning portion 7 due to the exchange coupling with hard magnetic film 7A or the antiferromagnetic film. The region of soft magnetic layer 6 that faces magnetically pinning portion 7 includes not only a part of first surface 6A of soft magnetic layer 6 that faces magnetically pinning portion 7, but also the entire region in the thickness direction (the Z direction). Thus, soft magnetic layer 6 is magnetized in substantially the same pattern in any X-Y plane.

On the other hand, the region of soft magnetic layer 6 that does not face magnetically pinning portion 7 is magnetized such that the magnetostatic energy etc. of soft magnetic layer 6 is minimized. In a soft magnetic body that is magnetized, magnetic domains are generally formed such that the magnetostatic energy etc. is minimized. When the magnetostatic energy etc. is minimized, the magnetic domains of the soft magnetic body that is magnetized are stabilized against an external magnetic field, and resistivity to an external magnetic field is improved. For this reason, the shapes of the magnetic domains are less likely to change in response to the variation of the external magnetic field, and the direction of a magnetic field that leaks from the soft magnetic body is also less likely to change. On the other hand, since a soft magnetic body having a single magnetic domain generally has large magnetostatic energy etc., the magnetic domains are easily deformed into a state having small magnetostatic energy etc. Therefore, the magnetic domains are easily deformed in response to the variation (disturbances) of an external field. In the present embodiment, since the region of soft magnetic layer 6 that faces magnetically pinning portion 7 is magnetized in the same direction as magnetically pinning portion 7, soft magnetic layer 6 is magnetized such that the magnetostatic energy etc. of the entire soft magnetic layer 6 is minimized while soft magnetic layer 6 keeps that state (the state in which the region of soft magnetic layer 6 that faces magnetically pinning portion 7 is magnetized in the same direction as magnetically pinning portion 7). In other words, the magnetic domains of the region of soft magnetic layer 6 that does not face magnetically pinning portion 7 are automatically formed such that the magnetostatic energy etc. of soft magnetic layer 6 is minimized, depending on the shape and the position of magnetically pinning portion 7.

As described above, soft magnetic layer 6 has a substantially rectangular parallelepiped shape, and first surface 6A is rectangular. First surface 6A has a pair of first sides 8 that face each other and a pair of second sides 9 that are perpendicular to first sides 8 and that face each other. First sides 8 are long sides of the rectangle. First face 6A has first central axis 10 that is parallel to first sides 8 and second central axis 11 that is parallel to second sides 9. In the present embodiment, first surface 6A is divided into two regions 11A, 11B by a straight line (first central axis 10) that is parallel to the long sides and that passes through the midpoints of two second sides 9 (the short sides). Regions 11A, 11B are referred to as imaginary small regions 11. In other words, first surface 6A is divided into a plurality of imaginary small regions 11, and imaginary small regions 11 consist of a pair of rectangular regions 11A, 11B each having a pair of sides having the same length as first sides 8 and a pair of sides having half the length of second sides 9. As shown in FIGS. 2A, 2B, magnetically pinning portion 7 face either one of imaginary small regions 11, that is, rectangular region 11A or 11B. In order to enhance the effect of pinning the magnetic domains of soft magnetic layer 6 by magnetically pinning portion 7, it is preferable that the region of magnetically pinning portion 7 that faces imaginary small region 11 substantially conform to the shape of rectangular region 11A or 11B and not protrude from rectangular region 11A or 11B. The magnetic domain of the region of soft magnetic layer 6 that does not face magnetically pinning portion 7 is magnetized antiparallel to the magnetization direction of the magnetic domain of the region that faces magnetically pinning portion 7. Soft magnetic layer 6 forms a circulating magnetic circuit in which the magnetic flux circulates both along the region that faces magnetically pinning portion 7 and along the region that does not face magnetically pinning portion 7. The outlined arrows in the drawing conceptually indicate the direction of the magnetic flux. The magnetic flux in rectangular region 11A or 11B exits rectangular region 11A or 11B, then enters adjacent rectangular region 11B or 11A, then exits rectangular region 11B or 11A, and enters rectangular region 11A or 11B in order to form a circulating magnetic circuit. The magnetostatic energy etc. is reduced by the circulating magnetic circuit. Further, in the present embodiment, two regions 11A, 11B are provided in line symmetry with respect to first central axis 10 that is parallel to first sides 8. The magnetic domains of soft magnetic layer 6 are further stabilized due to this configuration.

Second Embodiment

Figure 4A:
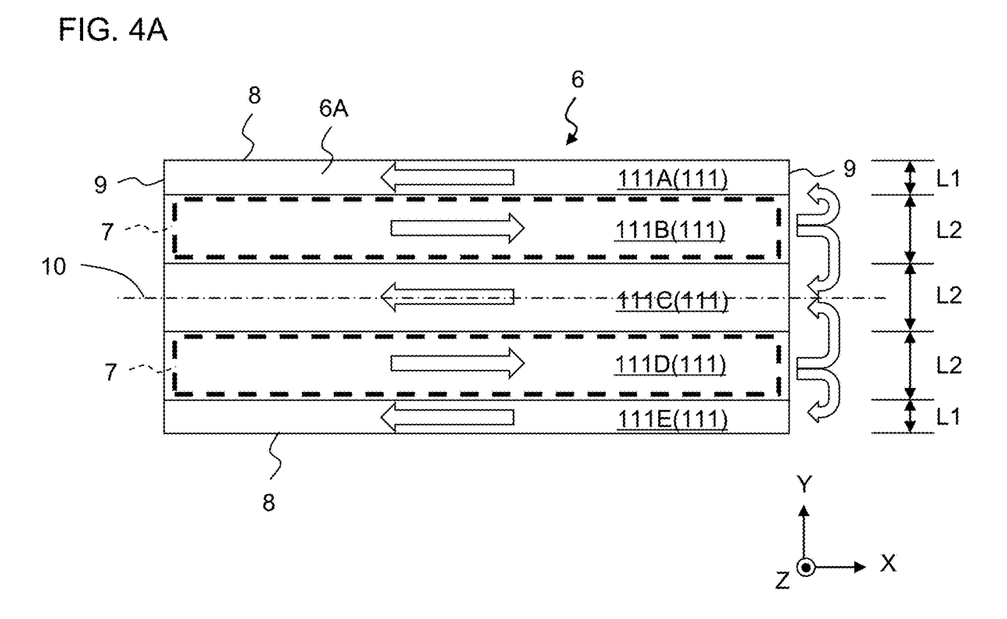
FIGS. 4A, 4B are plan views of the upper magnetic shield according to the second embodiment of the present invention.
Figure 4B:
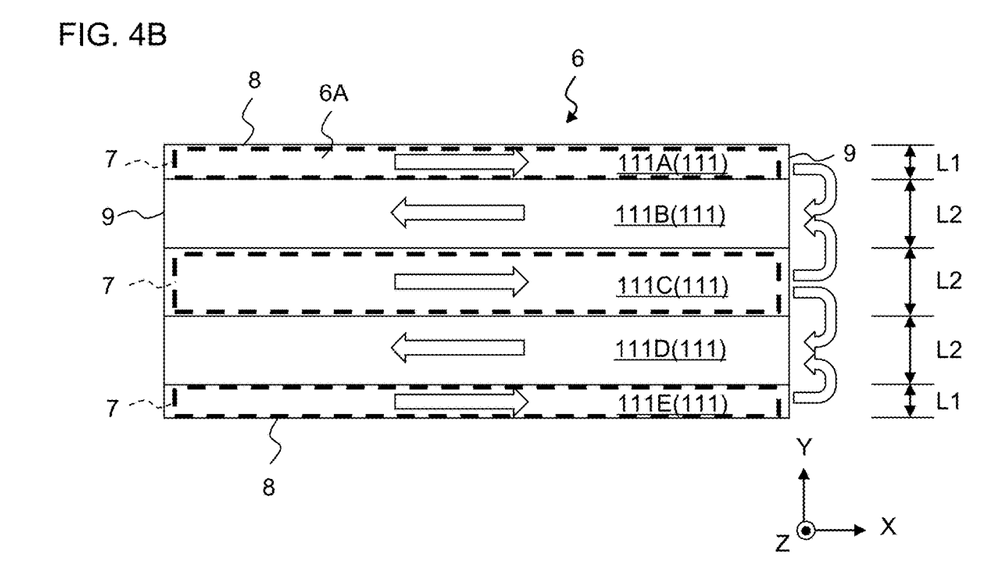

FIGS. 4A, 4B are plan views similar to FIGS. 2A, 2B showing upper magnetic shield 4 of the second embodiment. FIG. 4A and FIG. 4B show upper magnetic shield 4 having the same configuration except that the positions of magnetically pinning portions 7 are different. First surface 6A is divided into five imaginary small regions 111. Imaginary small regions 111 consist of five rectangular regions 111A to 111E each having a pair of sides having the same length as first sides 8 and a pair of sides that are shorter than second sides 9, and magnetically pinning portions 7 face every other second (every second) rectangular regions 111A to 111E. The number of imaginary small regions 111 is not limited to five. More generally, N imaginary small regions 111 (N is an integer equal to or greater than 3) may be provided, and a plurality of magnetically pinning portions 7 may be provided such that they face every other second (every second) region of the N rectangular regions. The widths (the dimensions in the Y direction) of imaginary small regions 111 may be the same or may be different, but it is preferable that imaginary small regions 111 be arranged in line symmetry with respect to first central axis 10. Specifically, the central axis of central imaginary small region 111C coincides with first central axis 10, and the other imaginary small regions 111A, 111B, 111D, 111E are arranged in line symmetry with respect to first central axis 10. The magnetic flux exits a region that faces magnetically pinning portion 7, and then enters the adjacent region that does not face magnetically pinning portion 7. Therefore, a plurality of circulating magnetic circuits is formed in the present embodiment. In the present embodiment, a plurality of magnetically pinning portions 7 face a plurality of imaginary small regions 111 that are not adjacent to each other. Therefore, the formation of magnetic domains in soft magnetic layer 6 can be easily controlled, and it is possible to ensure that the magnetic domains are formed as shown in the drawing. The widths in the Y direction of both rectangular regions that face a pair of first sides 8 (rectangular regions 111A, 111E in the embodiment) are L1, and the widths in the Y direction of the N−2 rectangular regions that are located between two rectangular regions 111A, 111E that face a pair of first sides 8 (rectangular regions 111B, 111C, 111D in the embodiment) are L2.

L1 may be equal to L2, but it is more preferable to satisfy L1:L2=1:2 in order to form stable magnetic domains.

Third Embodiment

Figure 5A:
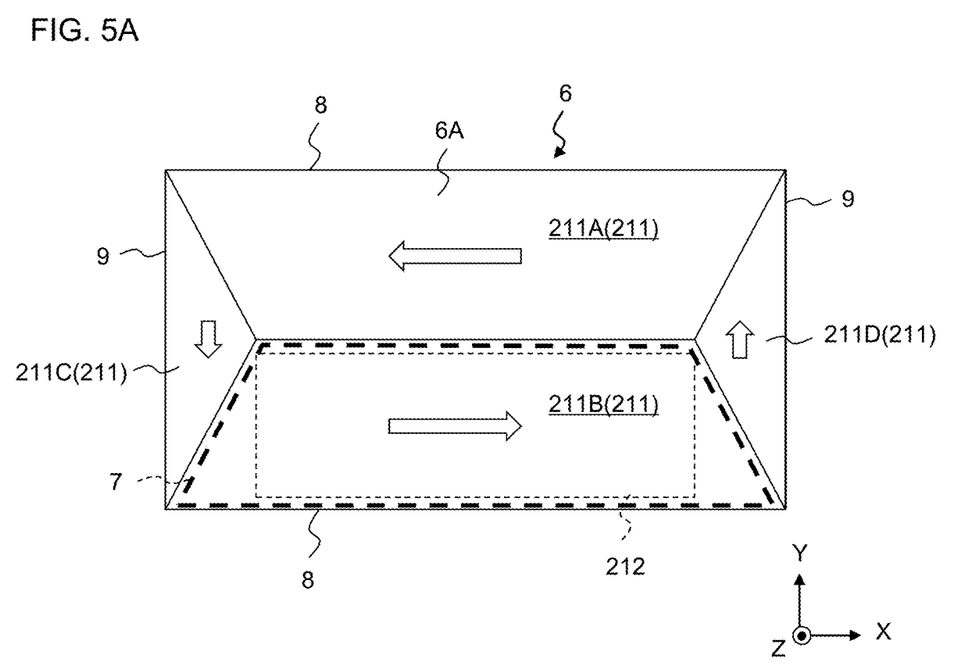
FIGS. 5A, 5B are plan views of the upper magnetic shield according to the third embodiment of the present invention.
Figure 5B:
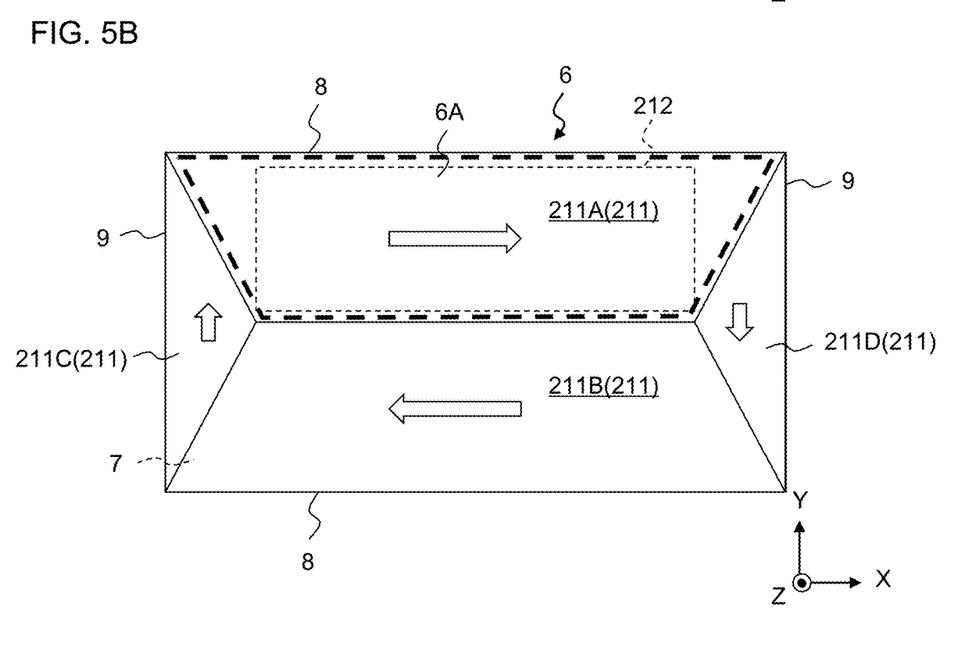

FIGS. 5A, 5B are plan views similar to FIGS. 2A, 2B showing upper magnetic shield 4 of the third embodiment. FIG. 5A and FIG. 5B show upper magnetic shield 4 having the same configuration except that the position of magnetically pinning portion 7 is different. First surface 6A is divided into four imaginary small regions 211. Four imaginary small regions 211 consist of two trapezoidal regions 211A, 211B each having a long side that is shared by one of first sides 8 and two triangular regions 211C, 211D each having a side that is shared by one side of second sides 9, and magnetically pinning portion 7 faces one region selected from among two trapezoidal regions 211A, 211B and two triangular regions 211C, 211D. As shown in FIGS. 5A, 5B, magnetically pinning portion 7 preferably faces either trapezoidal region 211A or trapezoidal region 211B in order to stabilize the magnetic domains. The magnetic flux circulates through two trapezoidal regions 211A, 211B and two triangular regions 211C, 211D. In the present embodiment, since only one circulating magnetic circuit is formed in soft magnetic layer 6, leakage of the magnetic field is reduced and the magnetic domains are further stabilized. The magnetic domains that consist of two trapezoidal regions 211A, 211B and two triangular regions 211C, 211D of the present embodiment are extremely stable, and the magnetostatic energy etc. is low. Therefore, as shown by the broken line in the drawing, even if magnetically pinning portion 7 consists, for example, of rectangular region 212 having a side that is shared by the short side of trapezoidal region 211A or 211B and having the same height as trapezoidal regions 211A, 211B, rectangular region 212 forms the same magnetic domains as magnetically pinning portion 7 shown in FIGS. 5A, 5B.

Fourth Embodiment

Figure 6A:
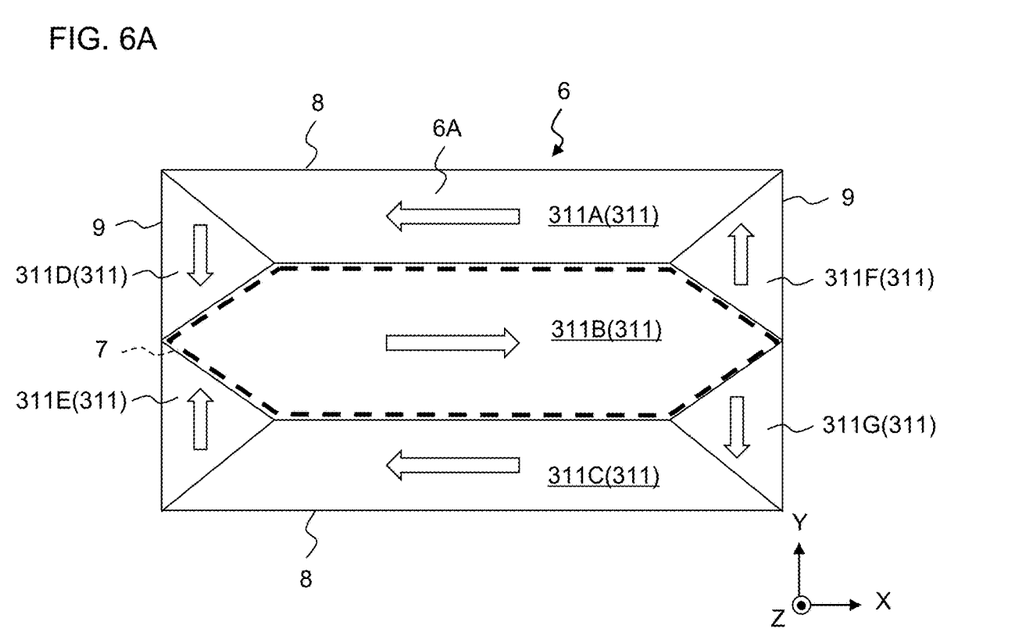
FIGS. 6A, 6B are plan views of the upper magnetic shield according to the fourth embodiment of the present invention.
Figure 6B:
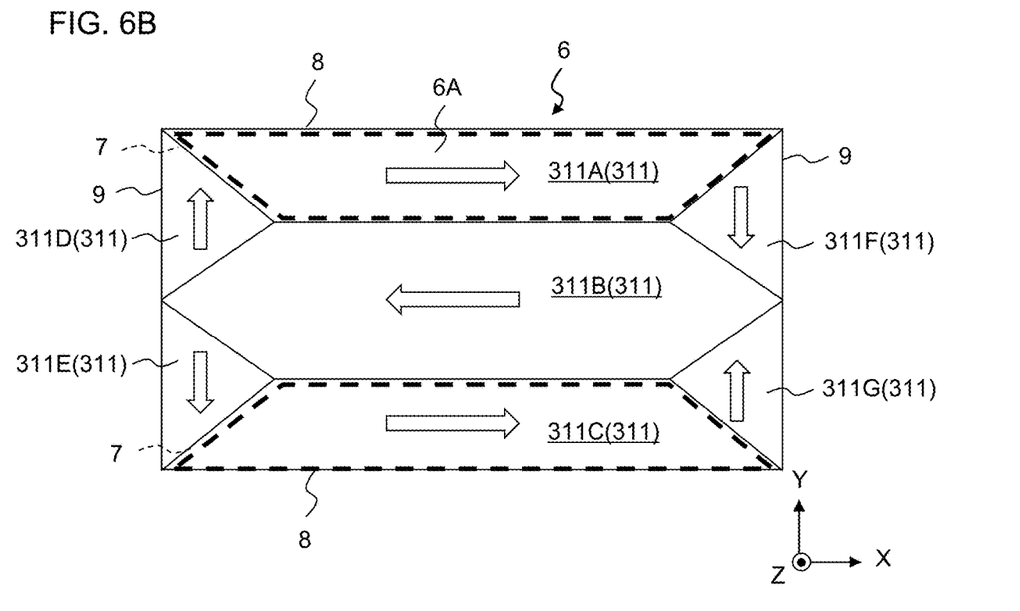

FIGS. 6A, 6B are plan views similar to FIGS. 2A, 2B showing upper magnetic shield 4 of the fourth embodiment. FIG. 6A and FIG. 6B show upper magnetic shield 4 having the same configuration except that the positions of magnetically pinning portions 7 are different. First surface 6A is divided into seven imaginary small regions 311. A plurality of imaginary small regions 311 consists of two trapezoidal regions 311A, 311C each having a long side that is shared by one side of first sides 8, four triangular regions 311D to 311G and one hexagonal region 311B. Two regions out of triangular regions 311D to 311G are provided on each short side of the rectangle, and one side of each of triangular regions 311D to 311G is shared by a half of the short side. Hexagonal region 311B fills the region that is surrounded by two trapezoidal regions 311A, 311C and four triangular regions 311D to 311G, and two sides opposite to each other are parallel to first sides 8. In FIG. 6A, magnetically pinning portion 7 is provided in hexagonal region 311B, and in FIG. 6B, magnetically pinning portions 7 are provided in trapezoidal regions 311A, 311C that are positioned on both sides. For example, in FIG. 6A, the magnetic flux exits hexagonal region 311B, then enters trapezoidal regions 311A, 311C via triangular regions 311F, 311G, and then returns to hexagonal region 311B via triangular regions 311D, 311E. Therefore, in the present embodiment, two circulating magnetic circuits are formed in soft magnetic layer 6.

Fifth Embodiment

Figure 7A:
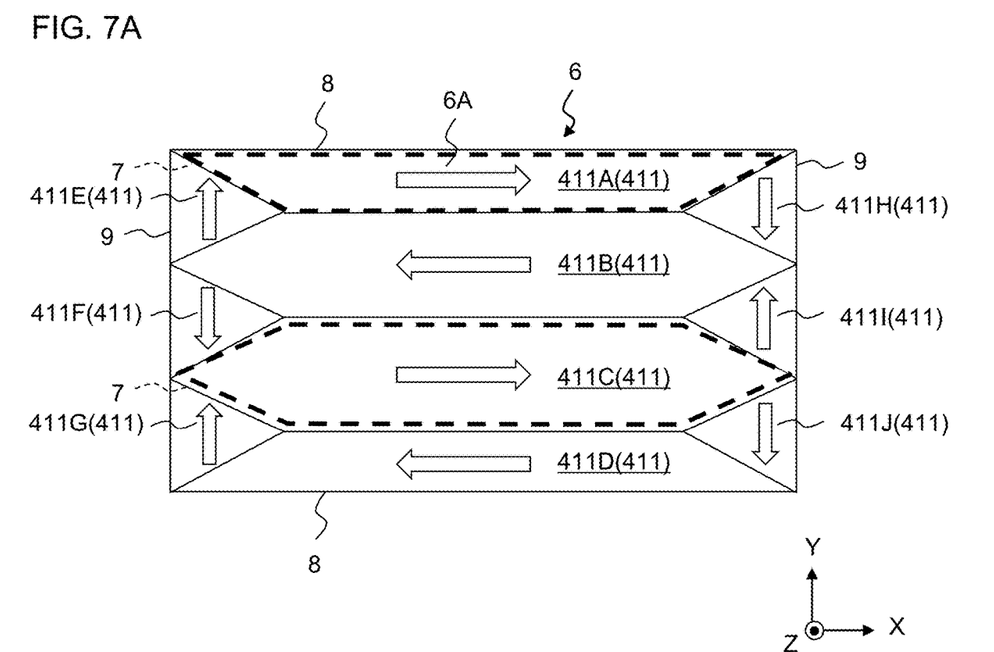
FIGS. 7A, 7B are plan views of the upper magnetic shield according to the fifth embodiment of the present invention.
Figure 7B:
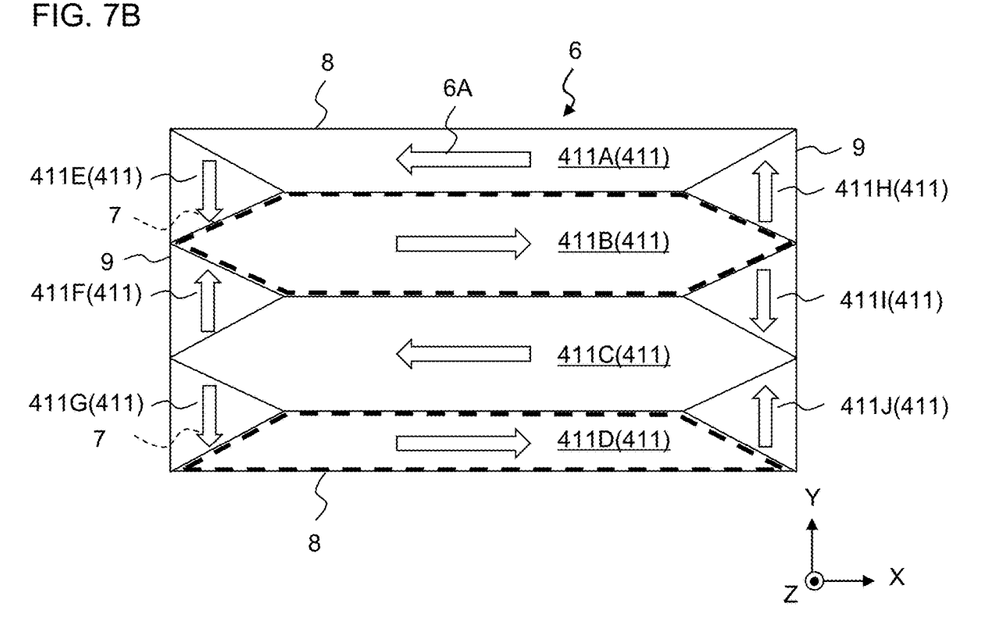

FIGS. 7A, 7B are plan views similar to FIGS. 2A, 2B showing upper magnetic shield 4 of the fifth embodiment. FIG. 7A and FIG. 7B show upper magnetic shield 4 having the same configuration except that the positions of magnetically pinning portions 7 are different. In the present embodiment, two hexagonal regions 411B, 411C are formed on first surface 6A. A plurality of imaginary small regions 411 consist of two trapezoidal regions 411A, 411D each having a long side that is shared by one of first sides 8, six triangular regions 411E to 411J and two hexagonal regions 411B, 411C. Each triangular region 411E to 411J has a side that is shared by a part of second side 9, and the same number of triangular regions 411E to 411J are arranged along both second sides 9. Two sides opposite to each other of each of two hexagonal regions 411B, 411C are parallel to first sides 8. More generally, when N is an integer equal to or greater than 2, a plurality of imaginary small regions 411 consists of two trapezoidal regions each having a long side that is shared by one of first sides 8, 2×(N+1) triangular regions and N hexagonal regions. The N hexagonal regions fill the region that is surrounded by the two trapezoidal regions and 2×(N+1) triangular regions, and two sides opposite to each other of each hexagonal region are parallel to first sides 8. A plurality of magnetically pinning portions 7 face every other second (every second) trapezoidal regions 411A, 411D and hexagonal regions 411B, 411C. In FIG. 7A, magnetically pinning portions 7 are provided in upper trapezoidal region 411A and lower hexagonal region 411C, and in FIG. 7B, magnetically pinning portions 7 are provided in lower trapezoidal region 411D and upper hexagonal region 411B. In the present embodiment, three circulating magnetic circuits are formed in soft magnetic layer 6.

Sixth Embodiment

Figure 8A:
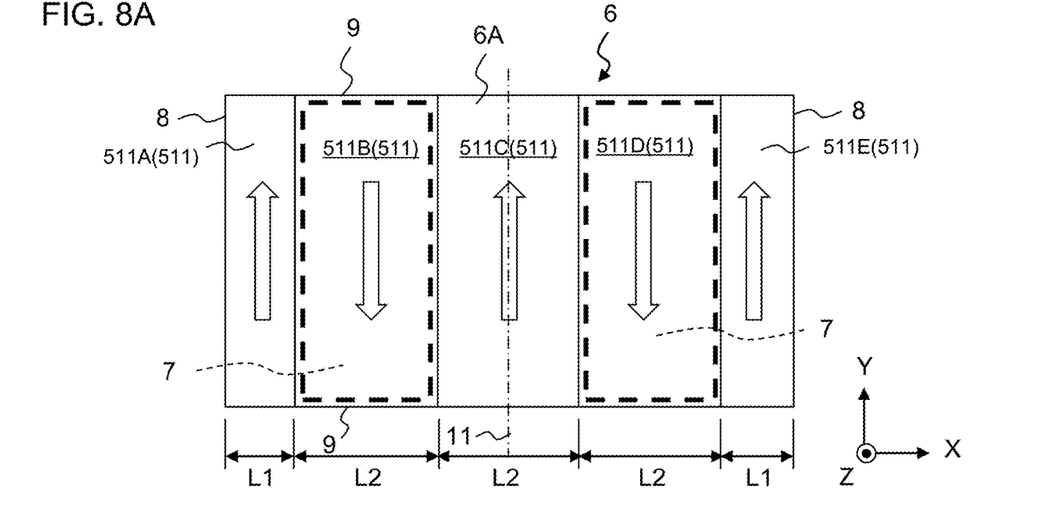
FIGS. 8A-8C are plan views of the upper magnetic shield according to the sixth embodiment of the present invention.
Figure 8B:
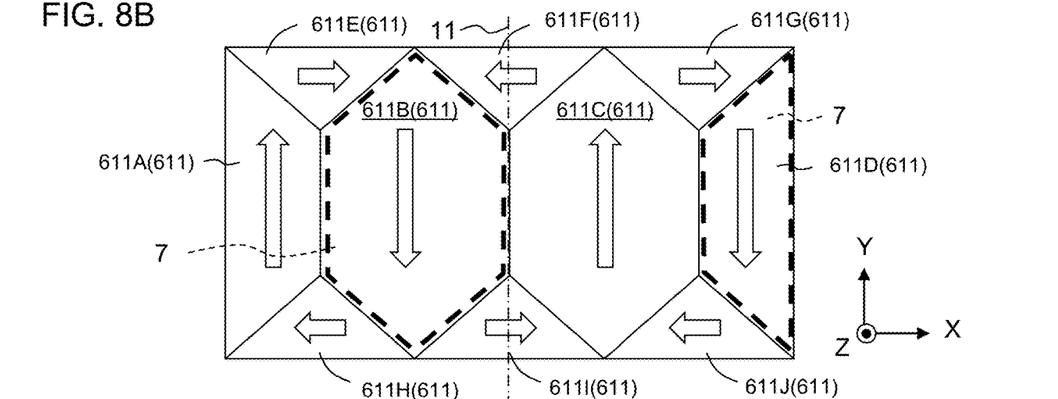
Figure 8C:
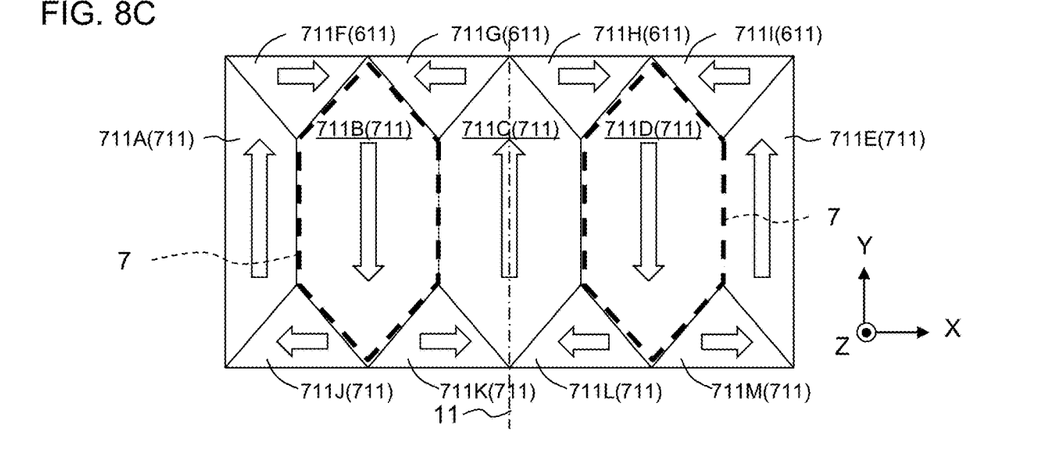

FIGS. 8A-8C are plan views similar to FIGS. 2A, 2B showing upper magnetic shield 4 of the sixth embodiment. In the present embodiment, magnetically pinning portions 7 are magnetized in the direction of the short sides, i.e., in the −Y direction. In the present embodiment, first sides 8 are short sides of a rectangle, and second sides 9 are long sides of the rectangle. Referring to FIG. 8A, first surface 6A is divided into five rectangular imaginary small regions 511 in the same manner as the second embodiment, and the long sides of each rectangular region 511A to 511E are parallel to the Y direction. Magnetically pinning portions 7 are provided in the second leftmost rectangular region 511B and the second rightmost rectangular region 511D. Both magnetically pinning portions 7 are magnetized in the −Y direction (and in the same direction). Although not shown, magnetically pinning portions 7 may be provided in rectangular regions 511A, 511C, 511E. The widths in the X direction of the two rectangular regions that face a pair of first sides 8 (rectangular regions 511A, 511E in the present embodiment) are L1, and the widths in the X direction of the rectangular regions located between two rectangular regions 511A, 511E that face a pair of first sides 8 (rectangular regions 511B, 511C, 511D in the present embodiment) are L2. L1 may be equal to L2, but it is more preferable to satisfy L1:L2=1:2 in order to stabilize the magnetic domains. Referring to FIG. 8B, first surface 6A is divided into two trapezoidal regions 611A, 611D, two hexagonal regions 611B, 611C and six triangular regions 611E to 611J in the same manner as the fifth embodiment, and magnetically pinning portions 7 are provided in one hexagonal region 611B and one trapezoidal region 611D. Both magnetically pinning portions 7 are magnetized in the −Y direction. Although not shown, magnetically pinning portions 7 may be provided in one hexagonal region 611C and one trapezoidal region 611A. Referring to FIG. 8C, first surface 6A is divided into two trapezoidal regions 711A, 711E, three hexagonal regions 711B to 711D and eight triangular regions 711F to 711M, and magnetically pinning portions 7 are provided in two hexagonal regions 711B, 711D. Both magnetically pinning portions 7 are magnetized in the −Y direction. Although not shown, magnetically pinning portions 7 may be provided in two trapezoidal regions 711A, 711E and one hexagonal region 711C. In the embodiments shown in FIGS. 8A to 8C, since the trapezoidal regions and the hexagonal regions are magnetized in the direction of the short sides, i.e., in the direction perpendicular to the easy axis that is formed based on the shape anisotropy, the magnetostatic energy etc. tends to increase, but magnetically pinning portions 7 form stable magnetic domains. Further, in the present embodiments, it is preferable that imaginary small regions 511, 611, 711 be provided in line symmetry with respect to second axis 11.

Seventh Embodiment

Figure 9A:
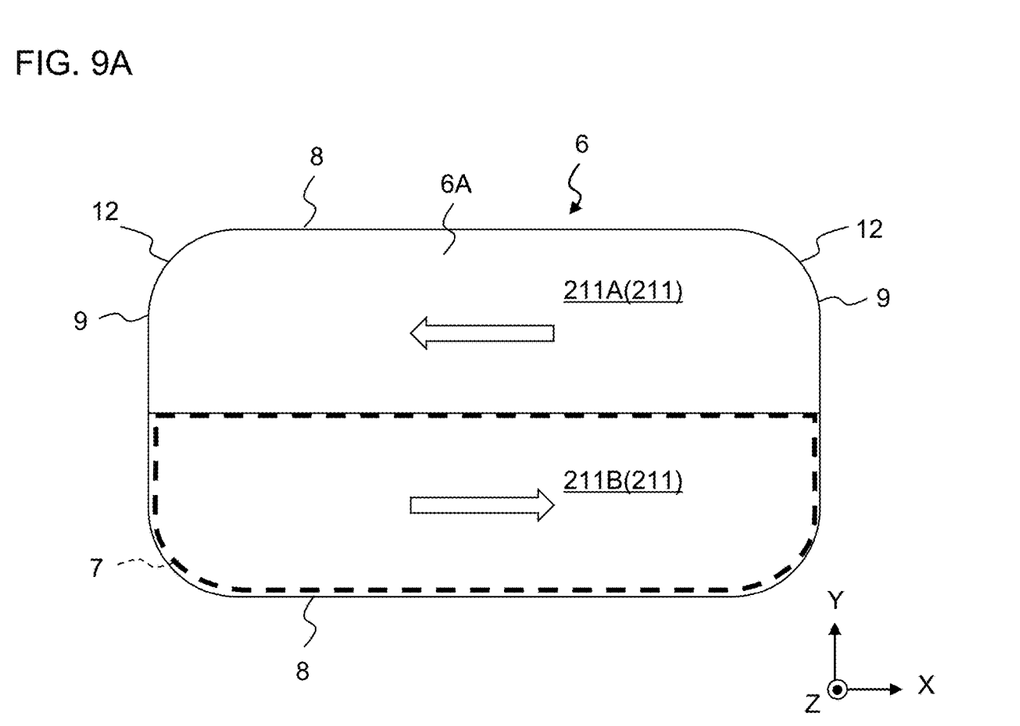
FIG. 9A, 9B are plan views of the upper magnetic shield according to the seventh embodiment of the present invention.
Figure 9B:
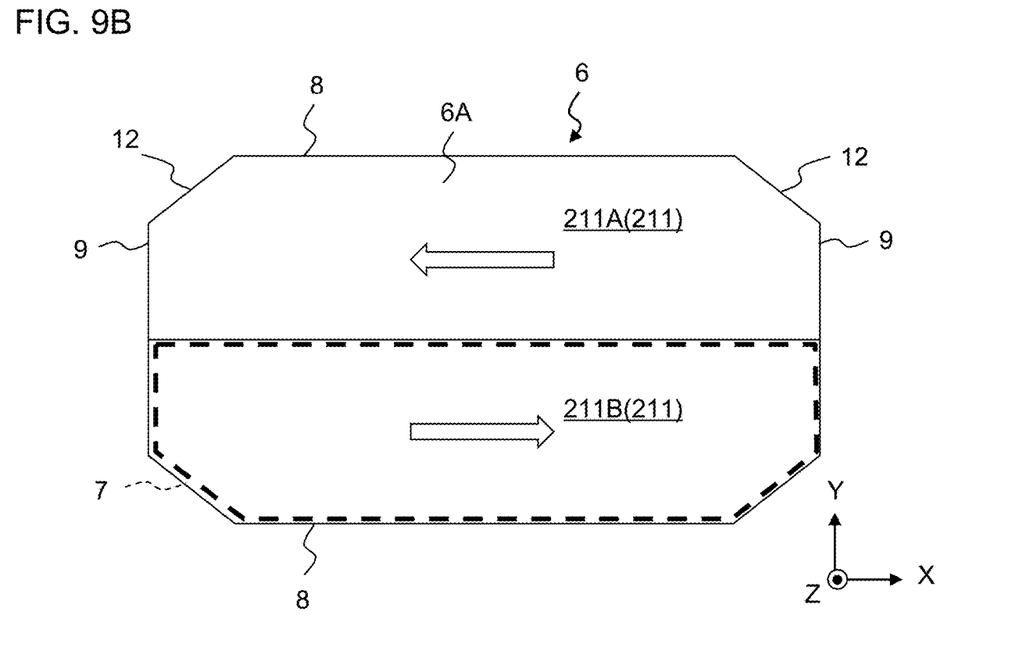

FIGS. 9A, 9B are plan views similar to FIGS. 2A, 2B showing upper magnetic shield 4 of the seventh embodiment. Referring to FIG. 9A, four corners 12 of soft magnetic layer 6 of the first embodiment are rounded. Referring to FIG. 9B, four corners 12 of soft magnetic layer 6 of the first embodiment are chamfered. The magnetic domains of soft magnetic layer 6 can be further stabilized by rounding or chamfering corners 12 where the magnetization direction is liable to be unstable. It is also possible to round or chamfer only one or some of corners 12. The present embodiment is also applicable to the second to sixth embodiments described above. In other words, first and second surfaces 6A, 6B of the first to sixth embodiments may have substantially rectangular shapes with rounded or chamfered corners 12.

Eighth Embodiment

Figure 10A:
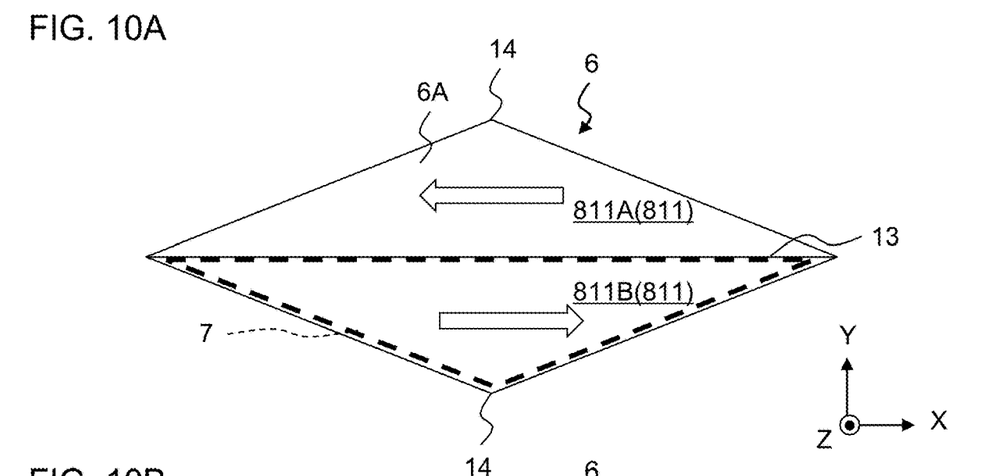
FIGS. 10A-10C are plan views of the upper magnetic shield according to the eighth embodiment of the present invention.
Figure 10B:
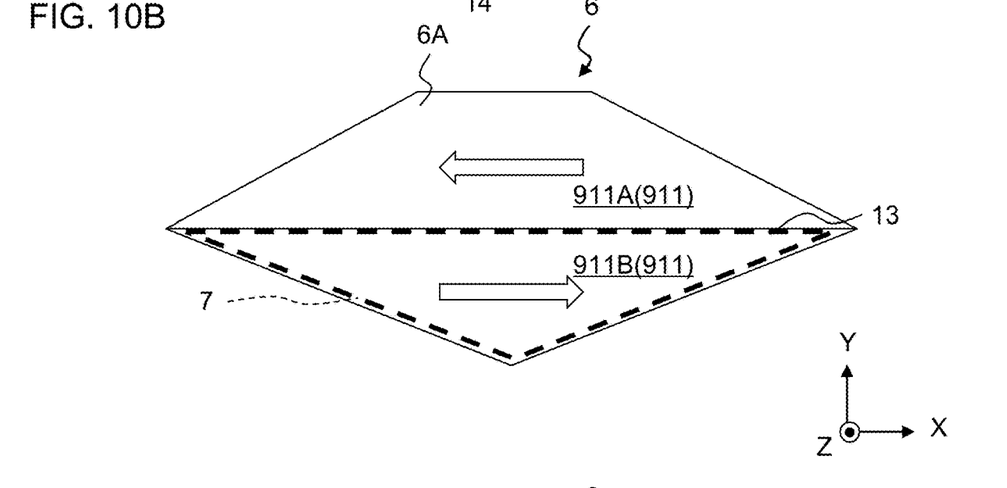
Figure 10C:
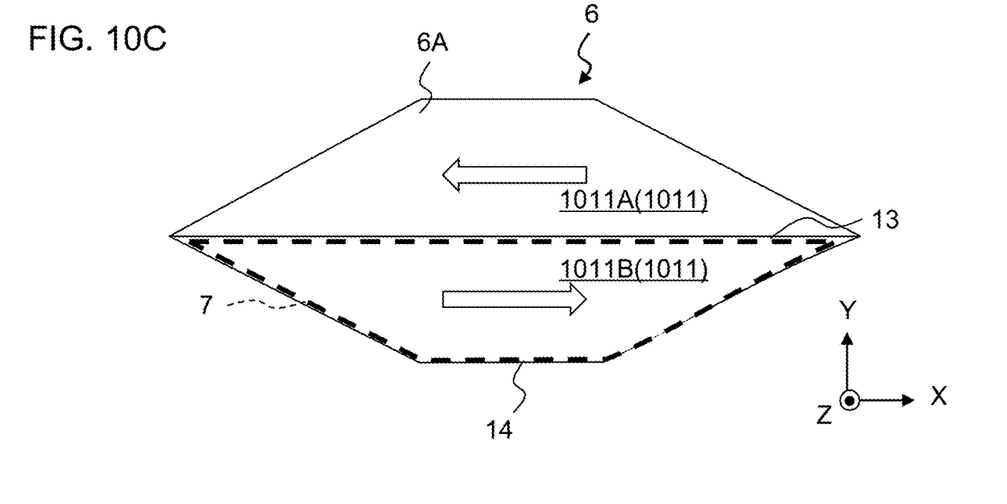

FIGS. 10A-10C are plan views similar to FIGS. 2A, 2B showing the eighth embodiment of upper magnetic shield 4. Referring to FIG. 10A, first and second surfaces 6A, 6B are diamond-shaped. First and second surfaces 6A, 6B are divided into a pair of imaginary small regions 811 that consist of two triangular regions 811A, 811B that share straight line 13 that connects vertices of the diamond that are opposite to each other, and magnetically pinning portion 7 faces either triangular region 811A or triangular region 811B. In the embodiment of FIG. 10A, corner 14 of one of the triangular regions that is opposite to straight line 13 may be chamfered. Specifically, referring to FIG. 10B, each of first and second surfaces 6A, 6B is a combination of triangular region 911B having a side that is shared by first side 13 and trapezoidal region 911A having a long side that is shared by first side 13. First and second surfaces 6A, 6B are divided into a pair of imaginary small regions 911 that consists of trapezoidal region 911A and triangular region 911B. Magnetically pinning portion 7 faces either trapezoidal region 911A or triangular region 911B. In the embodiment of FIG. 10A, corners 14 of both triangular regions that are opposite to straight line 13 may be chamfered. Specifically, referring to FIG. 10C, each of first and second surfaces 6A, 6B is a combination of first trapezoidal region 1011A having a long side that is shared by first side 13 and second trapezoidal region 1011B having a long side that is shared by first side 13 (that is, these regions share first side 13). First and second surfaces 6A, 6B are divided into a pair of imaginary small regions 1011 that consists of first trapezoidal region 1011A and second trapezoidal region 1011B. Magnetically pinning portion 7 faces either first trapezoidal region 1011A or second trapezoidal region 1011B.

Ninth Embodiment

Figure 11:
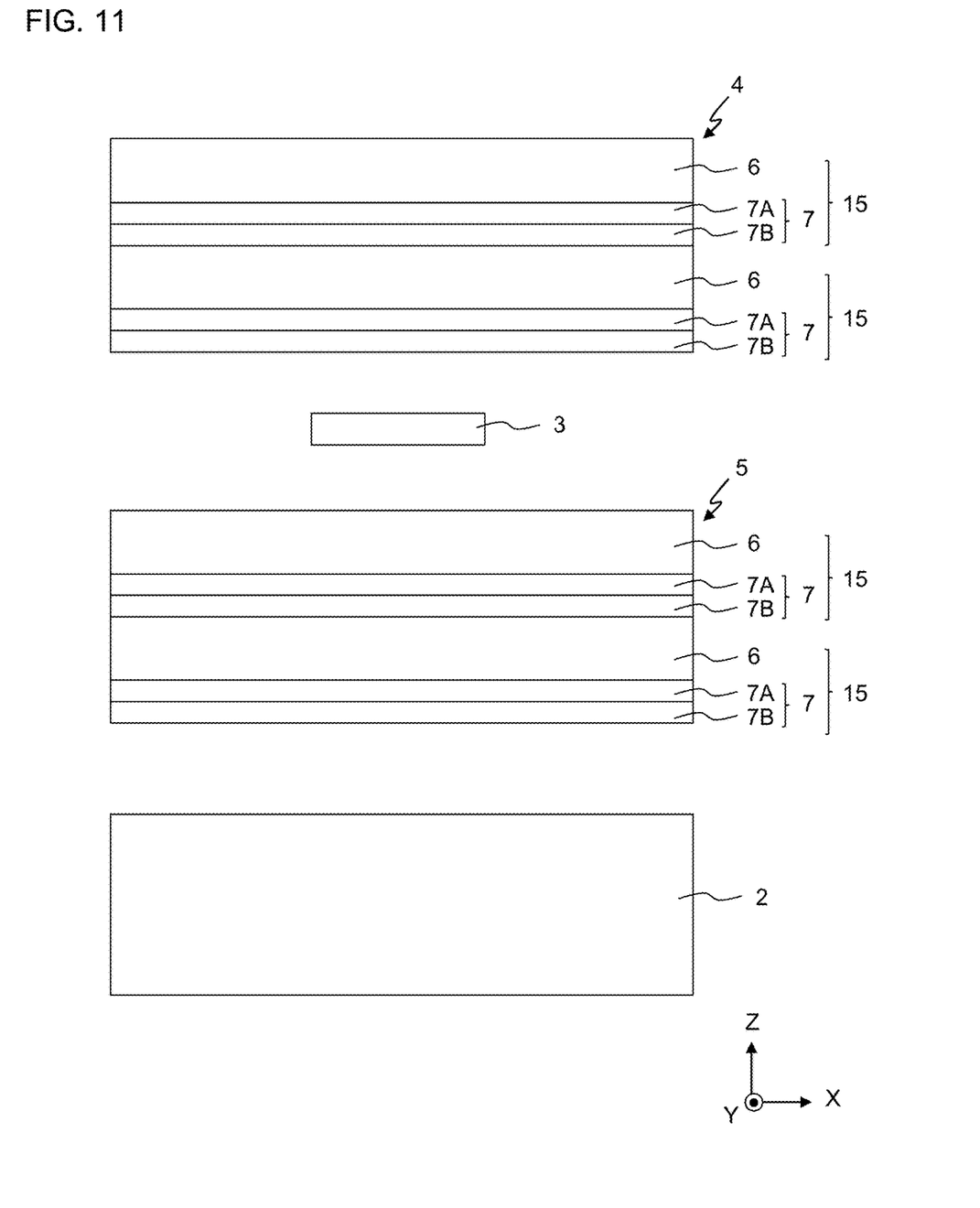
FIG. 11 is a side view of the upper magnetic shield and the lower magnetic shield according to the ninth embodiment of the present invention.

FIG. 11 is a side view similar to FIG. 1 showing upper magnetic shield 4 and lower magnetic shield 5 of the ninth embodiment. The planar configurations of magnetically pinning portion 7 and the imaginary small regions are not limited, but, for convenience, the planar configuration of the first embodiment shown in FIGS. 2A, 2B is shown. In the present embodiment, a plurality of sets 15 each including soft magnetic layer 6 and magnetically pinning portion 7 is provided, and sets 15 are stacked one on the other. When soft magnetic layer 6 is thick, the effect of pinning the magnetization by magnetically pinning portion 7 is less likely to reach remote regions in the Z direction from magnetically pinning portion 7 of soft magnetic layer 6. In the present embodiment, since each soft magnetic layer 6 can be thinned, the magnetic domains of soft magnetic layer 6 can be further stabilized.

Tenth Embodiment

Figure 12:
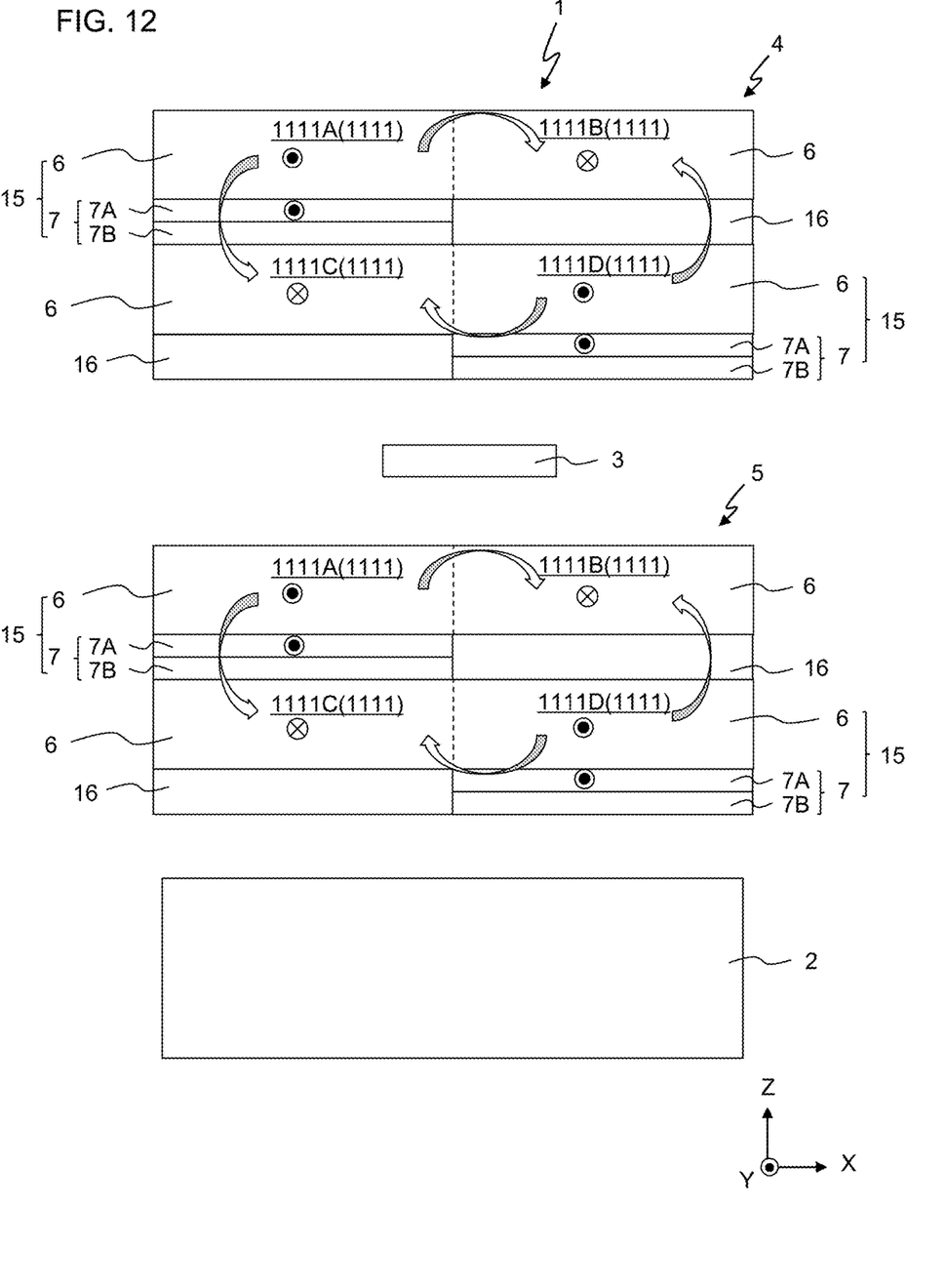
FIG. 12 is a side view of the upper magnetic shield and the lower magnetic shield according to the tenth embodiment of the present invention.

FIG. 12 is a side view similar to FIG. 1 showing upper magnetic shield 4 and lower magnetic shield 5 of the tenth embodiment. In the present embodiment, the planar configurations of magnetically pinning portion 7 and the imaginary small regions are also not limited, but, for convenience, the planar configuration of the first embodiment shown in FIGS. 2A, 2B is shown. Upper soft magnetic layer 6 is divided into two imaginary small regions 1111A, 1111B, and lower soft magnetic layer 6 is divided into two imaginary small regions 1111C, 1111D. As a result, four imaginary small regions 1111 are provided in total. In the present embodiment, a plurality of sets 15 are stacked such that magnetically pinning portions 7 of adjacent sets 15 do not overlap with each other, as viewed in the Z direction. Insulating layers 16 are provided where magnetically pinning portions 7 are not provided. As a result, the magnetic flux flows not only in laterally (the X direction) adjacent soft magnetic layer 6 but also in vertically (the Z direction) adjacent soft magnetic layer 6. For example, the magnetic flux that exits imaginary small region 1111A of upper soft magnetic layer 6 enters not only imaginary small region 1111B but also imaginary small region 1111C of lower soft magnetic layer 6. In the present embodiment, since a large number of circulating magnetic circuits are formed relative to the number of imaginary small regions 111, the magnetostatic energy etc. can be further reduced.

Although certain preferred embodiments of the present invention have been shown and described in detail, it should be understood that various changes and modifications may be made without departing from the spirit or scope of the appended claims.

What is claimed is:
1. A magnet flux absorber, comprising:
a soft magnetic layer having a first surface and a second surface that is a back surface of the first surface; and at least one magnetically pinning portion that faces a part of the first surface of the soft magnetic layer or a part of the second surface of the soft magnetic layer, wherein the first surface or the second surface of the soft magnetic layer that said at least one magnetically pinning portion faces has a first portion and a second portion, which is adjacent to the first portion, the at least one magnetically pinning portion faces the first portion, the first portion is magnetized in a predetermined direction, and the second portion is magnetized in a direction that is different from the predetermined direction.

2. The magnet flux absorber according to claim 1, wherein the first or second surface is rectangular and has a pair of first sides that face each other and a pair of second sides that face each other and are perpendicular to the pair of first sides that face each other, the first or second surface is divided into a plurality of imaginary small regions, and the magnetically pinning portion faces one of the imaginary small regions.

3. The magnet flux absorber according to claim 2, wherein the plurality of the imaginary small regions consists of a pair of rectangular regions each having a pair of sides having a same length as the first sides that face each other and a pair of sides whose length is half a length of the second sides, and the magnetically pinning portion faces one of the rectangular regions.

4. The magnet flux absorber according to claim 2, wherein the plurality of the imaginary small regions consists of two trapezoidal regions each having a long side that is shared by one of first sides and two triangular regions each having a side that is shared by one of second sides, and the magnetically pinning portion faces one region selected from among the two trapezoidal regions and the two triangular regions.

5. The magnet flux absorber according to claim 2, wherein the plurality of the imaginary small regions consists of two trapezoidal regions each having a long side that is shared by one of first sides, four triangular regions each having a side that is shared by a part of one of the second sides and a hexagonal region that fills a region that is surrounded by the two trapezoidal regions and the four triangular regions and that has two sides that are opposite to each other and that are parallel to the first sides, a same number of the triangular regions are arranged along both second sides, and the at least one imaginary small region faces either the two trapezoidal regions or the triangular region.

6. The magnet flux absorber according to claim 1, wherein the first or second surface is rectangular and has a pair of first sides that face each other and a pair of second sides that are perpendicular to the first sides and that face each other, and the at least one magnetically pinning portion comprises a plurality of magnetically pinning portions, and the first or second surface is divided into a plurality of imaginary small regions, and the magnetically pinning portions face some of the imaginary small regions, wherein said some of the imaginary small regions are not adjacent to each other.

7. The magnet flux absorber according to claim 6, wherein the plurality of the imaginary small regions consists of N rectangular regions (N is an integer equal to or greater than 3) each having a pair of sides having a same length as the first sides and a pair of sides that are shorter than the second sides, and the plurality of the magnetically pinning portions face every other second region of the N rectangular regions.

8. The magnet flux absorber according to claim 6, wherein the plurality of the imaginary small regions consists of two trapezoidal regions each having a long side that is shared by one of first sides, 2×(N+1) triangular regions each having a side that is shared by a part of one of the second sides (N is an integer equal to or greater than 2) and N hexagonal regions that fill a region that is surrounded by the two trapezoidal regions and the 2×(N+1) triangular regions, a same number of the triangular regions are arranged along both second sides, and each hexagonal region has two sides that are opposite to each other and that are parallel to the first sides, and the plurality of the magnetically pinning portions face every other second region of the trapezoidal regions and the triangular regions.

9. The magnet flux absorber according to claim 2, wherein the plurality of imaginary small regions is arranged in line symmetry with respect to a first central axis that is parallel to the first sides or with respect to a second central axis that is parallel to the second sides.

10. The magnet flux absorber according to claim 2, wherein the first surface or the second surface is rectangular, and the first side is a long side, and the at least one magnetically pinning portion is magnetized in a direction parallel to the first side.

11. The magnet flux absorber according to claim 2, wherein the first surface or the second surface is rectangular, and the first side is a short side, and the at least one magnetically pinning portion is magnetized in a direction parallel to the first side.

12. The magnet flux absorber according to claim 1, wherein the first or the second surface is diamond-shaped, and the first or second surface is divided into a pair of imaginary small regions that consist of two triangular regions, the two triangular regions share a straight line that connects vertices of the diamond that are opposite to each other, and the magnetically pinning portion faces one of the triangular regions.

13. The magnet flux absorber according to claim 1, wherein the first or the second surface is a combination of a triangular region and a trapezoidal region, the trapezoidal region has a long side that is shared by one side of the triangular region, and the first or second surface is divided into a pair of imaginary small regions that consists of the triangular region and the trapezoidal region, and the magnetically pinning portion faces either the triangular region or the trapezoidal region.

14. The magnet flux absorber according to claim 1, wherein the first or second surface is a combination of two trapezoidal regions that share long sides thereof, and the first or second surface is divided into a pair of imaginary small regions that consists of the two trapezoidal regions, and the magnetically pinning portion faces one of the trapezoidal regions.

15. The magnet flux absorber according to claim 1, further comprising a plurality of sets each including the soft magnetic layer and the at least one magnetically pinning portion, wherein the sets are stacked.

16. The magnet flux absorber according to claim 15, wherein the sets are stacked such that the magnetically pinning portions of adjacent sets do not overlap with each other, as viewed in a direction perpendicular to the first or the second surface.

17. The magnet flux absorber according to claim 1, wherein the magnetically pinning portion includes a hard bias film or an antiferromagnetic film.

18. The magnet flux absorber according to claim 1, wherein the first surface faces an object to be shielded.

19. A magnetic sensor comprising:
a magnet flux absorber according to claim 18; and
a magnetic field detecting element, which is the object.

20. The magnetic sensor according to claim 19, wherein the magnetic field detecting element is covered by the magnet flux absorber, as viewed in a direction perpendicular to the first or the second surface.

21. A magnetic flux absorber comprising:
a soft magnetic layer having a first surface that faces an object that is to be shielded and a second surface that is a back surface of the first surface; and at least one magnetization pinning portion that faces a part of the first surface of the soft magnetic layer or a part of the second surface of the soft magnetic layer, wherein a region of the soft magnetic layer that faces the magnetization pinning portion is magnetized in a same direction as the magnetization pinning portion, and a region of the soft magnetic layer that does not face the magnetization pinning portion is magnetized such that a sum of magnetostatic energy, exchange energy and magnetically anisotropic energy of the soft magnetic layer is minimized in a state in which the region that faces the magnetization pinning portion is magnetized in the same direction as the magnetization pinning portion.

22. A magnetic sensor, comprising:
a soft magnetic layer having a first surface and a second surface that is a back surface of the first surface;
at least one magnetically pinning portion that faces a part of the first surface of the soft magnetic layer or a part of the second surface of the soft magnetic layer; and
a magnetic field detecting element that is remote from both the soft magnetic layer and the at least one magnetically pinning portion,
wherein a region of the soft magnetic layer that faces the magnetically pinning portion is magnetized by the magnetically pinning portion in a direction that is different from a direction in which at least a part of remaining region of the soft magnetic layer is magnetized.

* * * * *